US006146812A

United States Patent [19]

Leon et al.

[11] Patent Number: 6,146,812

[45] Date of Patent: Nov. 14, 2000

[54] IMAGING MEMBER CONTAINING SWITCHABLE POLYMERS AND METHOD FOR USE

[75] Inventors: Jeffrey W. Leon; Shiying Zheng; Charles H. Appell; Ian Moir Hodge, all of Rochester, N.Y.

[73] Assignee: Kodak Polychrome Graphics LLC, Norwalk, Conn.

[21] Appl. No.: 09/399,191

[22] Filed: Sep. 17, 1999

Related U.S. Application Data

[63] Continuation-in-part of application No. 09/156,833, Sep. 18, 1998, Pat. No. 5,985,514.

[51] Int. Cl.[7] .................................................. G03F 7/004

[52] U.S. Cl. ..................................... 430/270.1; 430/303

[58] Field of Search ............................... 430/270.1, 302, 430/303

[56] References Cited

U.S. PATENT DOCUMENTS

| | | | |
|---|---|---|---|
| 3,658,534 | 4/1972 | Ishitani et al. | 96/48 |
| 3,964,389 | 6/1976 | Peterson | 101/467 |
| 4,034,183 | 7/1977 | Uhlig | 219/122 |
| 4,081,572 | 3/1978 | Pacansky | 427/53 |
| 4,405,705 | 9/1983 | Etoh et al. | 430/270 |
| 4,548,893 | 10/1985 | Lee et al. | 430/296 |
| 4,634,659 | 1/1987 | Esumi et al. | 430/302 |
| 4,693,958 | 9/1987 | Schwartz et al. | 430/302 |
| 4,743,533 | 5/1988 | Boggs et al. | 430/564 |
| 5,460,918 | 10/1995 | Ali et al. | 430/200 |
| 5,512,418 | 4/1996 | Ma | 430/271 |
| 5,569,573 | 10/1996 | Takahashi et al. | 430/138 |
| 5,713,287 | 2/1998 | Gelbart | 101/467 |

FOREIGN PATENT DOCUMENTS

| | | |
|---|---|---|
| 0293058 | 11/1988 | European Pat. Off. . |
| 0341825 | 11/1989 | European Pat. Off. . |
| 615162 | 9/1994 | European Pat. Off. . |
| 0652483 | 5/1995 | European Pat. Off. . |
| 0773478 | 5/1997 | European Pat. Off. . |
| 9197671 | 7/1997 | Japan . |
| 9209934 | 6/1992 | WIPO . |

OTHER PUBLICATIONS

Pappas and Hill, Kinetic Parameter Considerations For Maximizing Stability and Minimizing Cure Temperature of Thermosetting Coatings. *Journal of Coatings Technology,* 53(675):43–51.

*Primary Examiner*—Janet Baxter
*Assistant Examiner*—Barbara Gilmore
*Attorney, Agent, or Firm*—Baker Botts L.L.P.

[57] ABSTRACT

An imaging member is prepared by applying to a support a heat-sensitive imaging layer which comprises at least one heat-sensitive polymer capable of undergoing transformation from a hydrophilic to hydrophobic state or hydrophobic to hydrophilic state, wherein the transformation occurs such that the activation energy Ea and the Arrhenius pre-exponential factor A associated with the transformation simultaneously fulfill the relationships: $\ln(A) \geqq 0.4\ Ea + 8.84$ and $\ln(A) \leqq 1.69\ Ea - 14.37$. The imaging member is useful in processless thermal lithographic printing.

16 Claims, 1 Drawing Sheet

IMAGING MEMBER CONTAINING SWITCHABLE POLYMERS AND METHOD FOR USE

CROSS-REFERENCE TO RELATED APPLICATION

This application is a continuation-in-part of U.S. patent application Ser. No. 09/156,833, filed Sep. 18, 1998, now U.S. Pat. No. 5,985,514 which is incorporated herein by reference.

FIELD OF THE INVENTION

This invention relates to an imaging member for use in lithographic printing, and to a method of using such a member. More particularly, this invention relates to an imaging member for use in thermal, processless lithographic printing and a method of such use.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared negative working printing plate is moistened with water and an ink is then applied, the background or non-imaged areas retain the water and repel the ink while the imaged areas accept the ink and repel the water. The reverse holds true for positive working plates, in which the background is imaged. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are less common, yet represent a steadily growing market. Currently, most of these plates utilize similar materials and similar imaging mechanisms as UV-imageable plates. For example, in a resole-based plate, a thermal acid generator might be used in lieu of a photoacid generator and the same series of preheat and development steps might be employed. The main advantage of these digital plates is that the thermal imaging process is rapid and inexpensive compared to the analog process involving the creation of a mask and blanket UV exposure.

It is a desired aim in the lithographic printing industry to make this process even more rapid, cost effective, and efficient by eliminating the processing steps altogether. In the ideal situation, a plate would be imaged, placed directly on press, and immediately used. Plates of this type which image by an ablation method are known to those skilled in the art. The imaging of ablation plates typically causes the generation of unwanted material which can foul the optics of the imaging device and which must often be removed from the surface of the plate. This introduces the problem of collection and disposal ofthe extraneous material.

Accordingly, it would be desirable to employ an imaging member in a processless thermal lithographic printing process wherein the member was capable of being imaged without the attendant problem of material removal. It is one object of this invention to provide such an imaging member.

The imaging member of this invention contains at least one switchable polymer. By "switchable" as referred to herein, it is meant that the polymer is rendered from hydrophobic to relatively more hydrophilic, or conversely, from hydrophilic to relatively more hydrophobic, upon exposure to heat. Such polymers will undergo thermally driven chemical reactions in which highly polar moieties are either created or destroyed under imaging conditions. This results in the storage of the imaging data as hydrophilic and hydrophobic regions of a continuous polymer surface. In addition to being completely processless, such plates have the advantage of not needing any type of material collection devices which ablation-based plates require. Also unlike ablation plates, a switchable polymer plate in its ideal form would consist of one layer and can be manufactured on a single pass through a coater.

Though there are many such chemical reactions which may be of potential use for such application, it has been found that many of the reactions which would result in large polarity differentials between the background and foreground will be too slow under standard imaging conditions. Conversely, many reactions which are the most facile under thermal imaging conditions will also show some reactivity at ambient temperatures. Materials which react by these mechanisms, thus, will have a very short shelf life and will be unsuitable for commercial applications.

In view of the foregoing, it is another object of this invention to provide an imaging member containing at least one switchable polymer where the "switching" of the polymer is driven by chemical reactions which occur rapidly under thermal imaging conditions yet the polymer itself has low enough reactivity at ambient temperatures to have a useful shelf life.

SUMMARY OF THE INVENTION

Figure 1:
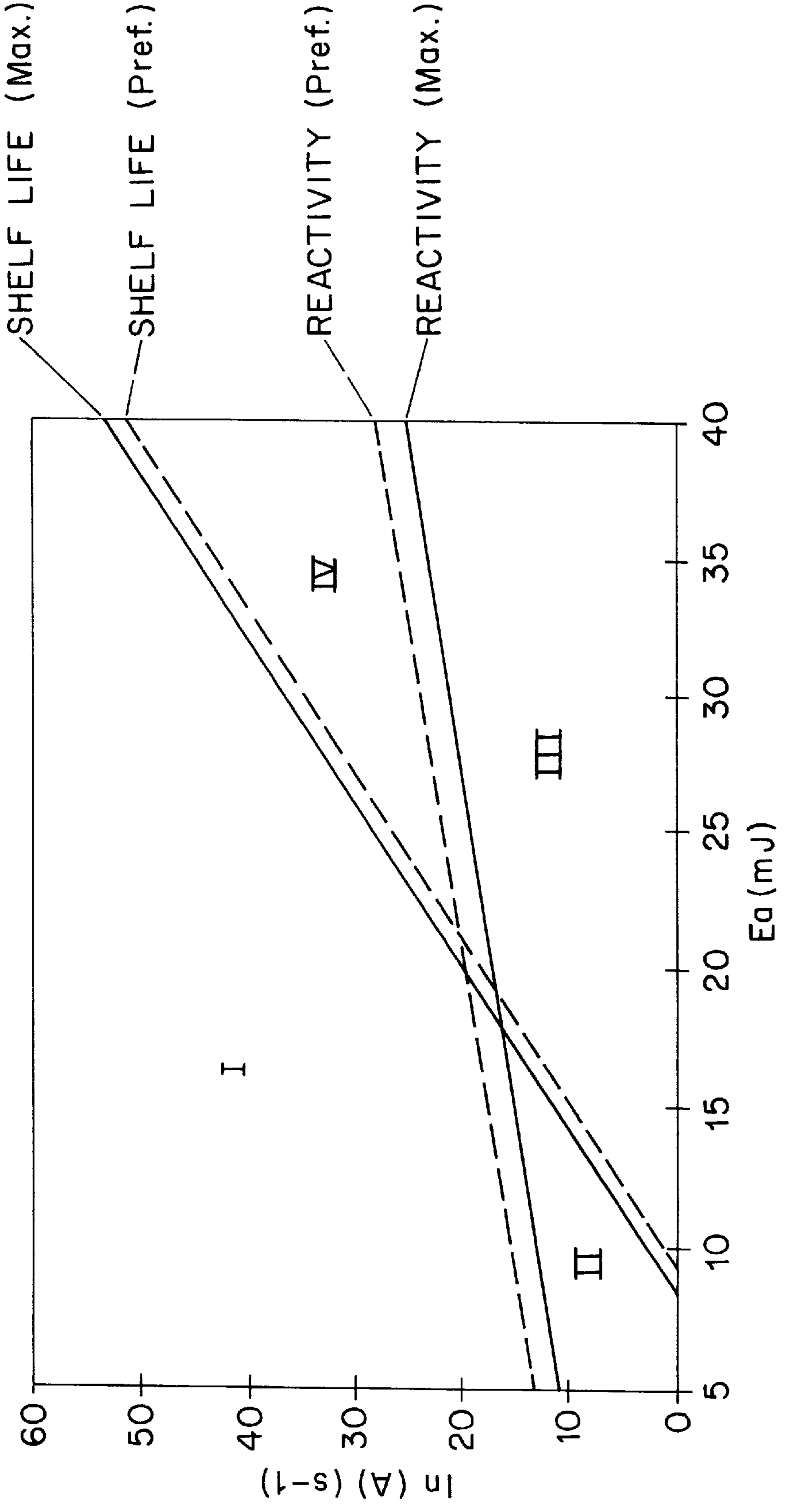
FIG. 1 sets forth a plot of activation energy (Ea) vs. the natural log of the Arrhenius pre-exponential factor (A), divided into four distinct quadrants, to further define the scope of the invention.

An imaging member is prepared by the process comprising applying to a support a heat-sensitive imaging layer which comprises at least one heat-sensitive polymer capable of undergoing transformation from a hydrophilic to hydrophobic state or hydrophobic to hydrophilic state, wherein the transformation occurs such that the activation energy Ea and the Arrhenius pre-exponential factor A associated with the transformation fulfill the relationships:

$$\ln(A) \geqq 0.4\ Ea + 8.84;\ \text{and}$$

$$\ln(A) \leqq 1.69\ Ea - 14.37.$$

In the present invention, the above relationships must be simultaneously fulfilled. The transformation preferably fulfills the relationships:

$$\ln(A) \geqq 0.4\ Ea + 11.05;\ \text{and}$$

$$\ln(A) \leqq 1.69\ Ea - 15.83.$$

Again, in the above-described preferred embodiment of this invention, both of the above relationships must be simultaneously fulfilled.

The imaging member of this invention is useful in a method of thermal, processless lithographic printing, which comprises:

(a) providing an imaging member prepared by the process comprising applying to a support a heat-sensitive imaging layer which comprises at least one heat-sensitive polymer capable of undergoing transformation from a hydrophilic to a hydrophobic state or from a hydrophobic to a hydrophilic state, wherein the transformation occurs such that the activation energy Ea and the Arrhenius pre-exponential factor A associated with the transformation fulfill the relationships:

$$\ln(A) \geqq 0.4\ Ea + 8.84, \text{ and}$$

$$\ln(A) \leqq 1.69\ Ea - 14.37;$$

(b) imagewise exposing the imaging member to energy to provide exposed and unexposed areas in the imaging layer, whereby exposed areas are rendered more oleophilic or hydrophilic than the unexposed areas by heat provided by the imagewise exposing.

(c) contacting the imagewise exposed imaging member with a lithographic printer ink; and (d) transferring imagewise the ink to a receiving material.

DETAILED DESCRIPTION OF THE INVENTION

Selection of reactive systems for the hardening of coatings by determining the kinetic activation parameters of the reactions in consideration is disclosed in S. P. Pappas, "Kinetic Parameter Considerations For Maximizing Stability and Minimizing Cure Temperature of Thermosetting Coatings," 53 J. Coatings Tech. 43 (1981), in which it is described that reactions with large activation energies (Ea) and large Arrhenius pre-exponential constants (A) will afford hardening at relatively low temperatures while still maintaining a long shelf life at room temperature. Though this paper applies this screening to a fundamentally different application, the general principles may be applied to thermally imageable printing plates.

It is known in the art that under standard imaging conditions with residence times of roughly 1–11 μs, temperatures of 700–100° C. may be reached. By performing simple kinetic calculations with these temperature measurements, predictions can be made as to conditions that must be fulfilled for a chemical reaction to have optimal utility in a thermal printing plate application. The most useful chemical reactions, thus, require half lives of approximately greater than or equal to 11 μs at 1000° C. (1273° K) to attain 50% conversion at a high exposure setting. The relationship between a reaction's half life ($t_{1/2}$) and its first order rate constant (k) is given by the equation:

$$k = 0.693/t_{1/2} \tag{I}$$

Substituting in the value of 11 μs for the half life, a minimum desirable rate constant of $k=6.3\times10^4\ s^{-1}$ is obtained.

The relationship between the rate constant of a reaction and the temperature is given by the Arrhenius equation:

$$\ln(k) = \ln(A) - \frac{Ea}{RT} \tag{II}$$

wherein R is the gas constant ($1.9872\times10^{-3}$ Kcal·mol$^{-1}$·° K$^{-1}$) and T is the temperature in degrees Kelvin. Substituting $6.3\times10^4\ s^{-1}$ as a minimum k and 1273° K for the temperature, the following condition is obtained for satisfactory imaging speed:

$$\ln(A) \geqq 0.40Ea + 8.84 \tag{1}$$

Different commercial platesetter devices can deliver the same amounts of net exposure (units of mJ/cm$^2$) in two ways; either by using high power settings at short residence times or by using low power settings at high residence times. The former conditions tend to favor ablation and thus attaining high exposures in this way is unsuitable for switchable polymer plates. It is believed that the 11 μs exposure time with a time-averaged net temperature of 1000° C. represents a reasonable set of parameters beyond which ablation becomes the dominant process. It is conceivable, however, that print heads containing large numbers of channels may allow for each individual pixel to be exposed several times in a single pass. With such devices, an effective exposure time longer than 11 μs figure may be obtained while simultaneously limiting ablation. Thus if the same calculations were repeated using a 100 μs exposure time and 1000° C., equation 2:

$$\ln(A) \geqq 0.40Ea + 11.05 \tag{2}$$

is obtained as an estimate of the absolute limiting kinetic parameters for reactivity under technologically reasonable imaging conditions. Higher residence times than this, while technologically feasible simply by using very slow drum speeds, would be unrealistic in practical situations. Operation of a platesetter under such conditions would result in very long net imaging times for a single plate. In lithographic printing, where productivity is a constant issue, such operating conditions would not be practical although they are technologically feasible in principle.

Similarly, to have a reasonable shelf life, a reaction should have a half life of no less than two months ($5.184\times10^6$ sec). Substituting into equation (I), a maximum desirable rate constant of $1.33\times10^{-7}\ s^{-1}$ is obtained. Substituting this maximum value for k and 298° K for room temperature into equation (II), the following condition is obtained for acceptable shelf life:

$$\ln A \leqq 1.69Ea - 14.37 \tag{3}$$

Equation 3, though it represents a preferred case, may not necessarily represent the absolute boundaries. It is conceivable that plates may exist which can operate well even if partially switched before imaging. It is also conceivable that, in certain situations a plate may be used within a very short period of time after being manufacturing. Thus, if the same calculations were applied to a half life of two weeks (representing an estimated minimum reasonable figure), equation 4:

$$\ln(A) \leqq 1.69Ea - 15.83 \tag{4}$$

is obtained as an absolute boundary.

If Equations 1–4 are plotted on a coordinate plane with Ea as the X axis and lnA as the Y axis, the graph may be divided into four distinct quadrants (see FIG. 1); quadrant 1 (acceptable speed, unacceptable shelf life), quadrant 2 (unacceptable speed and shelf life), quadrant 3 (unacceptable speed, acceptable shelf life), and quadrant 4 (acceptable speed and shelflife). The dashed lines represent the preferred conditions while the solid lines represent the absolute boundaries. Clearly, reactions with activation parameters that fall in quadrant 4 can be expected to show the best balance of favorable shelf life and imaging speed. It is desirable, thus, to select organic transformations with high Ea and lnA values for optimal utility in this application.

The present invention is directed to an imaging member which contains at least one switchable polymer, and to a method of using such a member in lithographic printing.

Such imaging member may be used in processless printing plates. The usefulness of any individual reaction for this invention is determined by experimental measurement of the activation energy (Ea) and Arrhenius pre-exponential factor (A). Reactions which will be fast enough under a diode laser printhead will have activation parameters which will fulfill equation 1 and will most preferably fulfill equation 2:

$$\ln(A) \geqq 0.40Ea + 8.84 \quad (1)$$

$$\ln(A) \geqq 0.40Ea + 11.05 \quad (2)$$

Similarly, reactions with a half life sufficient to ensure a product with an acceptable shelf life under reasonable storage conditions will have activation parameters which will fulfill equation 3 and will most preferably fulfill equation 4:

$$\ln(A) \leqq 1.69Ea - 14.37 \quad (3)$$

$$\ln(A) \leqq 1.69Ea - 15.83 \quad (4)$$

Thus, on a coordinate plane with ln(A) as the Y axis and Ea as the X axis, a reaction will be useable as a switchable polymer printing plate application if its activation parameters fall in the region wherein both equations 1 and 3, and most preferably equations 2 and 4, are fulfilled.

The switchable polymers of this invention are preferably polymers which are capable of switching from an ionic to a nonionic state. Polymers of this invention are most preferably selected from the group consisting of those compounds having repetitive units containing benzyl trialkylammonium halide functions, benzyltrialkyl ammonium carboxylate functions, bunte salts, or sulfonate oxime ester functions.

Methods for the determination of Arrhenius activation parameters are numerous and varied and are well known to those skilled in the art. The relevant theory and procedures to perform such a determination are described, for example, in I. N. Levine, Physical Chemistry (2d ed. 1983) and J. H. Espenson, Chemical Kinetics and Reaction Mechanisms (1995). Generally, an analytical method is chosen to measure the extent of conversion of a reaction as a function of time. Most of the kinetic studies published to date have been performed on chemical species in solution. Several analytical methods, however are especially well suited for the measurement of reaction rates (and hence rate constants and Arrhenius parameters) of reactions occurring in the solid state. For chemical transformations in which volatiles are given off, thermogravimetric analysis can be used to conveniently monitor the extent of conversion in a bulk solid, as described, for example, in Doyle, 5 J. Appl. Poly. Sci. 285 (1961) and Shah et al., 32 Macromolecules 413 (1999). Size exclusion chromatography has similarly been used to monitor the extent of conversion of reactions in solid polymers which result in chain scission and hence a change in molecular weight, as disclosed in Amerik et al., 4 Macromolecules 375 (1971). Infrared spectroscopy provides a method for measuring reaction rates in reactions where functional groups with clearly defined infrared signals are either created or destroyed. Attenuated total reflection infrared spectroscopy (ATR-IR), as described for example in Mirabella, Internal Reflection Spectroscopy (1993), is especially useful for monitoring reactions in solid media because only very minimal sample preparation is necessary. Infrared spectrometers can additionally be fitted with temperature-controlled sample stages. These types of apparatus are especially useful for performing kinetic studies in solid polymers. Consequently, this is the analytical method of choice for this invention. There exist numerous other analytical methods for performing kinetic studies of solid materials which will be familiar to those skilled in the art.

When a reaction is found to fulfill the aforementioned equations, chemical units which undergo this reaction must be incorporated into an appropriate polymer backbone containing the necessary chemical moieties to insure acceptable adhesion, crosslinking, handling, solution properties, etc. The synthetic and material details will vary from example to example and will be apparent to a skilled practitioner of the art. The polymers useful in this invention are readily prepared using known reactants and preparative and polymerization techniques and chemistry know to those skilled in the art. Monomers can be readily prepared using known procedures or purchased from a number of commercial sources. The amount of heat-sensitive polymer(s) used in the imaging layer of the imaging member is generally at least 0.1 $g/m^2$, and preferably from about 0.1 to about 10 $g/m^2$ (dry weight). This generally provides an average dry thickness of from about 0.1 to about 10 $\mu$m.

The imaging layer can also include one or more conventional surfactants for coatability or other properties, dyes or colorants to allow visualization ofthe written image, or any other addenda commonly used in the lithographic art, as long as the concentrations are low enough so they are inert with respect to imaging or printing properties.

Preferably, the heat-sensitive imaging layer also includes one or more photothermal conversion materials to absorb appropriate radiation from an appropriate energy source (such as a laser), which radiation is converted into heat. The photothermal conversion material(s) are generally present in an amount sufficient to provide a transmission optical density of at least 0.2, and preferably at least 1.0, at the operating wavelength of the imaging laser. Such materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family are also useful. One particularly useful pigment is carbon of some form (for example, carbon black). The size ofthe pigment particles should not be more than the thickness of the layer. Preferably, the size of the particles will be half the thickness of the layer or less. Useful absorbing dyes for near infrared diode laser beams are described, for example, in U.S. Pat. No. 4,973,572 (DeBoer), incorporated herein by reference. Particular dyes of interest are “broad band” dyes, that is those that absorb over a wide band of the spectrum. Mixtures of pigments, dyes, or both, can also be used. Particularly, useful infrared radiation absorbing dyes and pigments include those illustrated in Table A as follows:

TABLE A

IR Dye 1

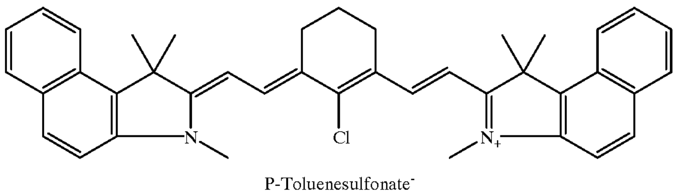

IR Dye 2

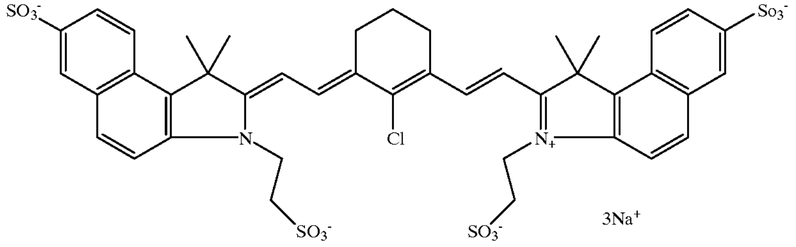

IR Dye 3

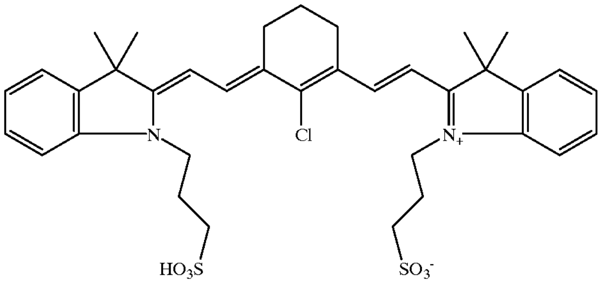

IR Dye 4

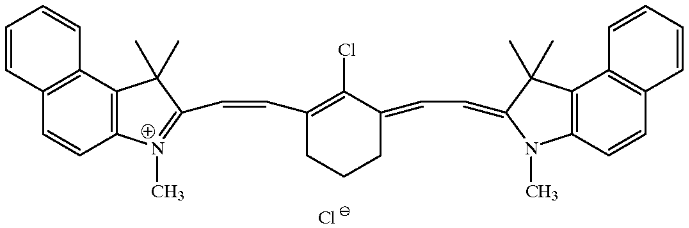

IR Dye 5

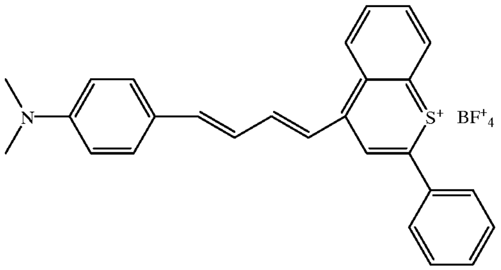

The heat-sensitive composition can be applied to the support using any suitable equipment and procedure, such as spin coating, knife coating, gravure coating, dip coating or extrusion hopper coating. The composition can also be applied by spraying onto a suitable support (such as an on-press printing cylinder).

The support can be any self-supporting material including polymeric films, glass, metals or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 mm. Another preferred embodiment uses a metal (such as aluminum) sheet having a thickness of from about 100 to about 600 $\mu$m. The support should resist dimensional change under conditions of use. The aluminum and polyester supports are most preferred for lithographic printing plates.

The support can also be a cylindrical surface having the heat-sensitive imaging polymer composition coated thereon, and can thus be an integral part ofthe printing press. The use of such cylinders is described for example in U.S. Pat. No. 5,713,287 (Gelbart), which is incorporated herein by reference.

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as copolymers prepared from vinylidene chloride) known for such purposes in the photographic industry, vinylphosphonic acid polymers, silicon-based sol-gel materials (such as those prepared from trialkoxysilanes), epoxy functional polymers and ceramics. The backside of the support may be coated with antistatic agents and/or slipping layers or matte layers to improve handling and "feel" of the imaging member.

The imaging member, however, preferably has only one layer, that is the heat-sensitive layer that is required for imaging. The imaging layer includes one or more switchable polymers, and optionally but preferably a photothermal conversion material (described above), and preferably provides the outer printing surface.

During use, the imaging member of this invention is exposed to a focused laser beam in the foreground or background areas depending on whether the plate functions as a negative working (See Examples 1, 2 and 4 below) or positive working (see Example 3 below) system. In a particularly preferred embodiment, the plate is imaged so that the background of the plate, which is generally a larger area, is not imaged, thereby avoiding the problems typically incurred when imaging to the edge of the plate. No additional heating, wet processing, or mechanical or solvent cleaning is needed after imaging and before the printing operation. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art.

Without the need for any wet processing after imaging, printing can then be carried out by applying any suitable lithographic ink and fountain solution to the imaging member printing surface, and then transferring the ink to a suitable receiving material (such as cloth, paper, metal, glass or plastic) to provide a desired impression of the image thereon. If desired, an intermediate blanket roller can be used to transfer the ink from the imaging member to the receiving material. The imaging members can be cleaned between impressions, if desired, using conventional cleaning means.

The invention is exemplified by the following examples, which are not meant to limit the invention in any way.

Comparative Example 1

Poly(p-xylidenetetrahydro-thiophenium chloride)

This polymer is known to undergo a thermally driven elimination reaction resulting in the loss of hydrochloric acid and tetrahydrothiophene. This reaction was shown to have Ea=31.2 kCal/mol and lnA=39.5 $s^{-1}$ when studied as a bulk solid by thermogravimetric analysis (see Shah et al., 32 Macromolecules 413 (1999)). The switching reaction, thus, can be placed in quadrant I (see FIG. 1) and thus is expected to show acceptable imaging speed and unacceptable shelf life.

The polymer was prepared as follows: Xylylene-bis-tetrahydrothiophenium chloride (5.42 g, 0.015 mol) was dissolved in 75 ml of deionized water and filtered through a frigged glass funnel to remove a small amount of insolubles. The solution was placed in a three-neck round-bottomed flask on an ice bath and was sparged with nitrogen for fifteen minutes. A solution of sodium hydroxide (0.68 g, 0.017 mol) was added dropwise over fifteen minutes via addition funnel. When about 95% of the hydroxide solution was added, the reaction solution became very viscous and the additional was stopped. The reaction was brought to pH 4 with 10% HCl and purified by dialysis for 48 hours.

A printing plate was prepared as follows: A solution (11.78 g) of poly(p-xylidenetetrahydrothiophenium chloride) (3.41% polymer by weight in 1:1 methanol:water) was combined with a solution (0.080 g) of IR Dye 3 dissolved in methanol (3.14 g). The solution was coated onto a plate of 150 $\mu$m thick grained, anodized aluminum support at a wet coverage of 67 g/m$^2$.

After drying, the resulting printing plate was imaged as described in Example 2 above at 830 nm wavelength. The exposure level was about 1000 mJ/cm$^2$, and the laser intensity was about 3 mW/$\mu$m$^2$.

The imaged, negative-working printing plate was wet with running water and rubbed with Van Son Diamond Black ink using a cloth wet with water. The imaged (exposed) areas of the plate took ink readily while the non-imaged (unexposed background) areas took no ink. The exposed areas of the plate accepted ink well indicating that the switching reaction had occurred with acceptable efficiency. Upon standing at room temperature over a month, however, a gelatinous precipitate formed in the coating solution. This was found to be partially switched polymer. In addition, plates which were aged for several weeks before being run on press showed severe background toning. Thus, the shelf life of this polymer was found to be too short for the polymer to be useful in a commercial product.

Comparative Example 2

Poly(methyl methacrylate-co-N-methyl-4-vinylpyridinium acetate) (9:1 molar ratio)

This polymer was prepared as follows: Methyl methacrylate (30 ml), 4-vinylpyridine (4 ml), AIBN (0.32 g, 1.95×$10^{-3}$ mol), and N,N-dimethylformamide (40 ml, DMF) were combined in a 250 ml round bottomed flask and fitted with a rubber septum. The Solution was spurged with nitrogen for 30 minutes and heated for 15 hours at 60° C. Methylene chloride and DMF (150 ml of each) were added to dissolve the viscous product and the product solution was precipitated twice into isopropyl ether. The precipitated polymer was filtered and dried overnight under vacuum at 60° C., and thereafter was dissolved in methylene chloride (50 ml) and reacted with methyl p-toluene sulfonate (1 ml) at reflux for 15 hours. NMR analysis of the reaction showed that only partial N-alkylation had occurred. The partially reacted product was precipitated into hexane, then dissolved in neat methyl methane sulfonate (25 ml) and heated at 70° C. for 20 hours. The product was precipitated once into diethyl ether and once into isopropyl ether from methanol and dried under vacuum overnight 60° C. A flash chromatography column was loaded with 300 cm$^3$ of DOWEX® 550 acetate ion exchange resin (that is, Dowex® 550A OH resin converted to the acetate form using acetic acid). The polymer product was dissolved in methanol, passed through the column, and stored as a 10% (w/w) methanolic solution.

A kinetic study was performed in which this polymer was heated in a Bio-Rad FTS-60 spectrophotometer fitted with a Graseby Specac Golden Gate temperature-controlled diamond ATR accessory. The rate constants at several temperatures in the range of 70–220° C. were determined by monitoring the disappearance of a band at 1601 $cm^{-1}$. A classical first order Arrhenius plot was prepared by plotting the natural logarithm of the rate constants versus the reciprocal of the temperatures. The Ea was determined to be 18.0 Kcal/mol and the lnA was determined to be 16.5 $s^{-1}$. The switching reaction, thus, can be placed in quadrant II (see FIG. 1) and is expected to have unacceptable imaging speed and shelf life.

When this polymer was allowed to stand at room temperature in a 5% (w/w) methanolic solution, it grew cloudy and discolored after a week and a precipitate began to form after two weeks. This precipitate was identified as the partially switched polymer. This material was determined to be unacceptable for this application due to an insufficient shelf life.

Comparative Example 3

Poly (2-(4-diphenyliodoniumoxy)ethyl methacrylic tosylate)

This polymer was prepared by a two step procedure:

(1) Poly (phenoxyethyl methacrylate): Phenoxyethyl methacrylate (19.41 g) was combined with azobisisobutyronitrile (AIBN) (0.39 g) and tetrahydrofuran (146 ml) in a 250 round bottomed flask with a rubber septum secured with a strap tie. The reaction solution was bubble degassed with nitrogen for 15 minutes and heated at 50° C. overnight. The crude product was precipitated into diethyl ether and dried in a vacuum over at 60° C. for 4 hours to afford 13.2 g (68.0%) of the product as a white powder.

(2) Poly (2-(4-diphenyliodoniumoxy)ethyl methacrylate): Poly (phenoxyethyl methacrylate) (10.00 g, $4.85 \times 10^{-2}$ mol-repeating units), hydroxy(tosyloxy)iodobenzene (26.43 g, $6.74 \times 10^{-2}$ mol), glacial acetic acid (20 ml) and methylene chloride (80 ml) were combined in a 250 ml round bottom flask and stirred for 15 hours at 45° C. The product was precipitated twice into 2.5 L isopropanol and dried in a vacuum oven overnight at 50° C. 24.00 g (85%) of a white powder was collected.

The polymer was coated on a KBr window and heated in a Bio-Rad FTS-60 spectrophotometer fitted with a Graseby Specac Eurotherm infrared transmission heating accessory. The rate constants at several temperatures in the range of 70–220° C. were determined by monitoring the disappearance of a band at 678 $cm^{-1}$. A classical first order Arrhenius plot was prepared by plotting the natural logarithm of the rate constants versus the reciprocal of the temperatures. The Ea was determined to be 24.2 Kcal/mol and the lnA was determined to be 18.2 $s^{-1}$. The switching reaction, thus, can be placed in quadrant III and is expected to have unacceptable imaging speed and acceptable shelf life.

A coating formulation of this polymer was prepared consisting of the polymer (0.959 g), 1.439 g of FX-GE-003 (a carbon dispersion produced by the Nippon Shokubai Co.), methanol (8.801 g), and water (8.801 g). This mixture was coated on a grained, anodized aluminum sheet with a sufficient wet laydown to ensure a coverage of 100 mg/$ft^2$ (1.08 g/$m^2$ of the polymer and dried at 80° C. for five minutes.

The plate was exposed on a platesetter having an array of laser diodes operating at a wavelength of 830 nm each focused to a spot diameter of 23 μm. Each channel provided a maximum of 450 mW of power incident upon the recording surface. The plate was mounted on a drum, the rotation speed of which was varied to provide for a series of exposures at 360, 450, 600, and 900 mJ/$cm^2$. The laser beams were modulated to produce halftone dot images. Reflectance infrared spectra were taken of the areas of maximum (100%) density of each exposure. In all cases, the infrared spectra were identical to that of an unexposed area of the plate. This indicates that no switching had occurred under the imaging conditions.

Approximately one year after synthesis, the polymer was analyzed by infrared and 1 H NMR spectroscopy. Both spectra were identical to spectra taken immediately after synthesis, indicating that no switching had taken place during storage.

Example 1

Poly(vinylbenzyl trimethylammonium chloride-co-N-(3-aminopropyl) methacrylamide hydrochloride) (19:1 molar ratio)

This polymer was prepared as follows: Vinylbenzyl trimethylammonium chloride (19 g, 0.0897 mol, 60:40 mixture of p,m isomers), N-(3-aminopropyl)methacrylamide hydrochloride (1 g, 0.00562 mol), 2,2'-azobis(2-methylpropionamidine) dihydrochloride (0.1 g), and deionized water (80 ml) were combined in a round bottom flask fitted with a rubber septum. The reaction mixture was bubble degassed with nitrogen for 15 minutes and placed in a water bath at 60° C. for four hours. The resulting viscous product solution was precipitated into acetone, dried under vacuum at 60° C. for 24 hours, and stored in a dessicator. A kinetic study was performed in which this polymer was heated in a Bio-Rad FTS-60 spectrophotometer fitted with a Graseby Specac Golden Gate temperature-controlled diamond ATR accessory. The rate constants at several temperatures in the range of 70–220° C. were determined by monitoring the disappearance of a quaternary C—N band at 753 $cm^{-1}$. A classical first order Arrhenius plot was prepared by plotting the natural logarithm of the rate constants versus the reciprocal of the temperatures. The Ea was determined to be 36.8 Kcal/mol and the lnA was determined to be 28.4 $s^{-1}$. The 24 switching reaction, thus, can be placed in quadrant IV (see FIG. 1) and expected to have acceptable imaging speed and shelf life.

The polymer was formulated with an IR dye, coated on gelatin-subbed poly (ethylene terephthalate), imaged, and evaluated as follows: A melt was prepared by dissolving 0.254 g of this polymer and 0.025 g of IR Dye 4 in 4.37 g of a mixture of methanol and water (3/1 w/w). After mixing, and just before coating, a solution of bis-vinylsulfonylmethane (BVSM, 0.353 g, 1.8% by wt. in water) was added and the mixture was coated with a wire wound rod on a K Control Coater (Model K202, RK Print-Coat Instruments LTD) to a wet thickness of 25 μm on gelatin-subbed poly(ethylene terephthalate). The coatings were dried in an oven for four minutes at 70–80° C.

The printing plate was exposed in an experimental platesetter having an array of laser diodes operating at a wavelength of 830 nm, each focused to a spot diameter of 23 μm. Each channel provides a maximum of 450 mW of power incident on the recording surface. The plate was mounted on a drum whose rotation speed was varied to provide for a serious of images set at various exposures. The laser beams were modulated to product halftone dot images. The extent of conversion of the switching reaction at various exposures was measured by ATR-IR by monitoring the disappearance of a quaternary C—N band at 753 $cm^{-1}$ (see Table 1 below).

It is clear from the results that substantial switching had occurred at all exposures. The plate was mounted on a commercial A. B. Dick 9870 duplicator press and impressions (prints) were made using VanSon Diamond Black lithographic printing ink and Universal Pink fountain solution containing PAR alcohol substitute (Varn Products Company). The exposed areas of the printing plates readily accepted ink at all exposed regions of the plate.

The polymer batch used in the formulation of this plate was used for subsequent printing plate formulations on several instances over a twelve month period and showed no observable loss of reactivity.

TABLE 1

Extent of conversion of Poly(vinylbenzyltrimethylammoniumchloride-co-N-(3-aminopropyl) methacrylamide hydrochloride) (19:1 molar ratio) as a function of exposure

| Exposure (mJ/cm$^2$) | % Reacted |
|---|---|
| 0 | 0 |
| 360 | 51.2 |
| 450 | 62.7 |
| 600 | 80.8 |
| 900 | 96.1 |

Example 2

Poly(vinylbenzyltrimethylammononium acetate-co-N-(3-aminopropyl) methacrylamide) (19:1 molar ratio)

This polymer was prepared from poly[vinylbenzyl trimethylammonium chloride-co-N-(3-aminopropyl) methacrylamide hydrochloride] (19:1 molar ratio) (Example 2) using an ion exchange process. A flash chromatography column was filled with 300 cc of DOWEX® 550A OH ion exchange resin and the resin was washed with about 1 L of methanol. About 1 L of 10% (v/v) acetic acid in methanol was passed through the column followed by 1 L of methanol. 3.0 g of the polymer of example 2 as a 10% solution in methanol was passed through the acetate resin column twice with the column being regenerated with 10% methanolic acetic acid between each pass. The polymer was recovered by precipitation into THF. The isolated material (1.27 g) was dried in a vacuum oven at 50° C. overnight.

A kinetic study was performed in which the acetate polymer was coated on a KBr window and heated in a Bio-Rad FTS-60 spectrophotometer fitted with a Graseby Specac Eurotherm infrared transmission heating accessory. The rate constants at several temperatures in the range of 70–220° C. were determined by monitoring the disappearance of a quaternary C—N band at 753 cm$^{-1}$. A classical first order Arrhenius plot was prepared by plotting the natural logarithm of the rate constants versus the reciprocal ofthe temperatures. The Ea was determined to be 33.7 Kcal/mol and lnA was determined to be 31.5 s$^{-1}$. The switching reaction, thus, can be placed in quadrant IV (see FIG. 1) and expected to have acceptable imaging speed and shelf life.

The polymer was formulated with an IR dye, coated on gelatin-subbed poly (ethylene terephthalate), imaged, and run on a commercial A. B. Dick 9870 duplicator press in an identical manner as described in Example 1. The exposed areas of the printing plates readily accepted ink at all exposed regions of the plate.

This polymer was formulated and evaluated two months after synthesis and showed acceptable performance, indicating adequate shelf life.

Example 3

Poly(vinyl benzyl thiosulfate sodium salt-co-methyl methacriylate)

Preparation: Vinyl benzyl chloride (10 g, 0.066 mol), methyl methacrylate (26.23 g, 0.262 mol), and AIBN (1.08 g, 7 mmol) were dissolved 180 ml of toluene. The solution was purged with dry nitrogen and then heated at 65° C. overnight. After cooling to room temperature, the solution was dropwise added to 2000 ml of methanol. The white powdery polymer was collected by filtration and dried under vacuum at 60° C. overnight. 1H NMR analysis indicate that the copolymer contained 30 mol % of vinyl benzyl chloride.

The above polymer (18 g) was dissolved in 110 ml of DMF. To this solution was added sodium thiosulfate (9 g) and 20 ml of water. Some polymer precipitated out. The cloudy reaction mixture was heated at 70° C. for 24 hours. After cooling to room temperature, the hazy reaction mixture was transferred to a dialysis membrane and dialyzed against water. A small amount of the resulting polymer solution was freeze dried for elemental analysis and the rest was stored and used as a solution. Elemental analysis indicated that all the benzyl chloride was converted to sodium thiosulfate salt.

A kinetic study was performed in which this polymer was heated in a Bio-Rad FTS-60 spectrophotometer fitted with a Graseby Specac Golden Gate temperature-controlled diamond ATR accessory. The rate constants at several temperatures in the range of 70–220° C. were determined by monitoring the disappearance of a band at 1032 cm$^{-1}$. A classical first order Arrhenius plot was prepared by plotting the natural logarithm of the rate constants versus the reciprocal of the temperatures. The Ea was determined to be 43.1 Kcal/mol and the lnA was determined to be 35.6 s$^{-1}$. The switching reaction, thus, can be placed in quadrant IV (see FIG. 1) and is expected to have acceptable imaging speed and acceptable shelf life.

The polymer was formulated with an IR dye, coated on gelatin-subbed poly (ethylene terephthalate), imaged, and run on press as follows: a formulation was prepared containing 0.20 g polymer, 0.02 g IR Dyc 3, 4 g water and 1.0 g of methanol. The formulation containing 4.21 weight % of solids was coated at 100 mg/ft$^2$ (1.08 g/m$^2$) dry coverage onto a gelatin-subbed 0.10 mm poly(ethylene terephthalate) support. The resulting printing plate was dried in a convection oven at 82° C. for 3 minutes, clamped on the rotating drum of a conventional platesetter and digitially exposed to an 830 nm laser printhead at exposure levels ranging from 550 to 1350 mJ/cm$^2$. The resulting blue-green coating rapidly discolored to typically off-white color in the exposed regions.

A sample of the laser exposed printing plate was then mounted on the plate cylinder of a full page commercially available A. B. Dick 9870 duplicator press for an actual press run using commercially available black ink and Varn Universal Pink fountain solution (Varn Products Co.). The fountain solution simultaneously removed nonimaged areas of the printing surface. The plate rolled up fast and acceptably printed 1000 printed sheets with full density. The exposed areas of the printing plates readily accepted ink at all exposed regions of the plate. The polymer batch used in the formulation of this plate was used for a subsequent printing plate formulation ten months after synthesis and showed no observable loss of reactivity.

Example 4 poly( -tetralone oxime 3-methacrvloyl-propane sulfonate)

This polymer was synthesized by a two step procedure:

(1) -tetralone oxime 3-methacryloyl-propane sulfonate: -Tetralone oxime (6.0 g) reacted with 3-methacryloyl-propane sulfonyl chloride (7.8 g) in 17 ml of pyridine to give white crystalline product which was recrystallized from mixed solvent of hexane and diethyl ether.

(2) poly( -tetralone oxime 3-methacryloyl-propane sulfonate): -Tetralone oxime 3-methacryloyl-propane sulfonate (1.5 g) and AIBN (14 mg) were dissolved in 3 ml of toluene in a 25 ml round-bottomed flask capped with a rubber septum. The solution was purged with dry nitrogen for 10 minutes and then heated at 60° C. for 16 hours. The solidified product was diluted with 15 ml of DMF and precipitated into 150 ml of methanol. The white powdery polymer was collected and dried under vacuum at 40° C. overnight.

A kinetic study was performed in which this polymerwas heated in aBio-Rad FTS-60 spectrophotometer fitted with a Graseby Specac Golden Gate temperature-controlled diamond ATR accessory. The rate constants at several temperatures in the range of 70–220° C. were determined by monitoring the disappearance of a band at 791 $cm^{-1}$. A classical first order Arrhenius plot was prepared by plotting the natural logarithm of the rate constants versus the reciprocal of the temperatures. The Ea was determined to be 28.7 Kcal/mol and the lnA was determined to be 27.6 $s^{-1}$. The switching reaction, thus, can be placed in quadrant IV (see FIG. 1) and is expected to have acceptable imaging speed and acceptable shelf life.

A heat-sensitive imaging formulation was prepared from the following components: Polymer (0.20 g); IR Dye 1 (0.02 g); DMF (0.50 g); THF (4.5 g). The formulation containing 4.21 weight % of solid was coated at 100 mg/$ft^2$ of dry coverage (1.08 g/$m^2$) on 0.14 mm aluminum support which was electrochemically grained and anodized and post treated with poly(vinyl phosphonic acid-co-acrylamide) at 80:20 weight ratio. The resulting printing plate was dried in a convection oven at 82° C. for 3 minutes, clamped on the rotating drum of an image setting machine and was digitally exposed to an 830 nm laser printhead at dosages ranging from 300 to 660 mJ/$cm^2$. The blue-green coating rapidly discolored to a typically orange-tan color in the exposed regions. When black lithographic ink was applied to each exposed plate while under a stream of tap water, the non-exposed regions were found to readily accept ink whereas the exposed regions remained wet with water and free of ink.

A sample of the laser exposed plate was then mounted on the plate cylinder of a full page A. B. Dick lithographic duplicator press. The plate showed fast roll-up and several hundred impressions of acceptable quality were made. This polymer was formulated and evaluated three months after synthesis and showed acceptable performance, indicating adequate raw stock keeping.

It should be understood that various changes and modifications to the preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. An imaging member prepared by the process comprising applying to a support a heat-sensitive imaging layer which comprises at least one heat-sensitive polymer capable of undergoing transformation from a hydrophilic to hydrophobic state or hydrophobic to hydrophilic state, wherein the transformation occurs such that the activation energy Ea and the Arrhenius pre-exponential factor A associated with the transformation fulfill the relationships:

$$\ln(A) \geqq 0.4\ Ea + 8.84;\ \text{and}$$

$$\ln(A) \leqq 1.69\ Ea - 14.37.$$

2. The member of claim 1, wherein Ea and A fulfill the relationships:

$$\ln(A) \geqq 0.4\ Ea + 11.05;\ \text{and}$$

$$\ln(A) \leqq 1.69\ Ea - 15.83.$$

3. The member of claim 1, wherein the polymer is selected from the group consisting of poly(vinylbenzyl trimethyl ammonium chloride-co-N-(3-aminopropyl) methacrylamide hydrochloride), poly(vinylbenzyl trimethylammonium acetate-co-N-(3-aminopropyl) methacrylamide), poly (vinylbenzyl thiosulfate sodium salt-co-methyl methacrylate), and poly( -tetralone oxime 3-methacryloyl-propane sulfonate).

4. The member of claim 1, wherein the polymer is selected from the group consisting of compounds comprising repetitive units having benzyl trialkylammonium halide functions, benzyltrialkylammonium carboxylate functions, bunte salts, and sulfonate oxime ester functions.

5. The member of claim 1, wherein the polymer is capable of transformation from an ionic to a nonionic state.

6. The member of claim 1, wherein the polymer is present in a concentration of at least 0.1 g/$m^2$.

7. The member of claim 6, wherein the polymer is present in a concentration of about 0.1–10 g/$m^2$.

8. The member of claim 1, wherein the imaging layer additionally comprises at least one photothermal conversion material capable of absorbing radiation and converting the radiation to heat.

9. The member of claim 8, wherein the photothermal conversion material is at least one infrared radiation absorbing dye selected from the group consisting of:

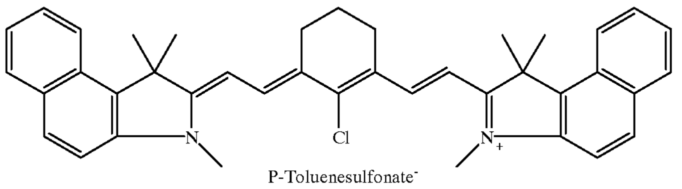

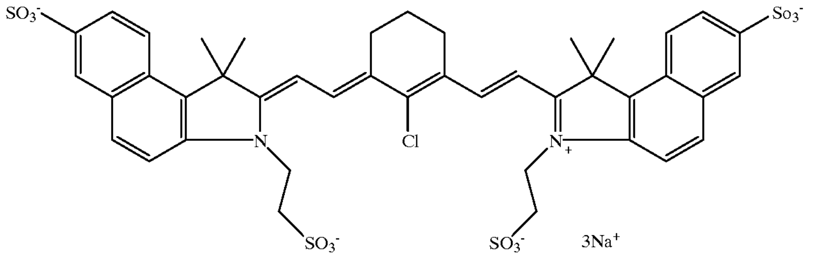

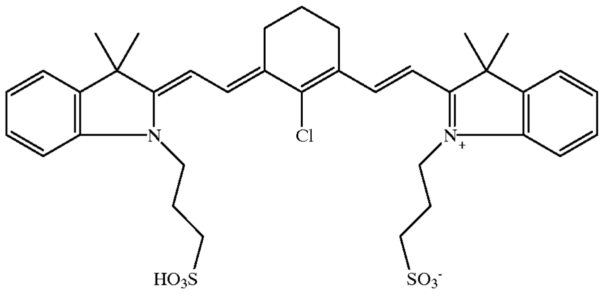

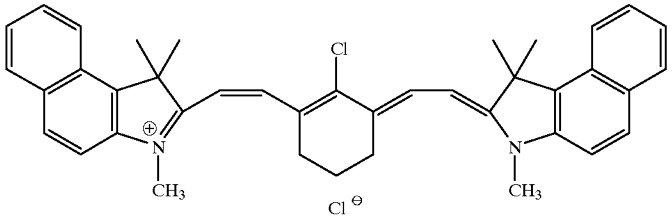

and

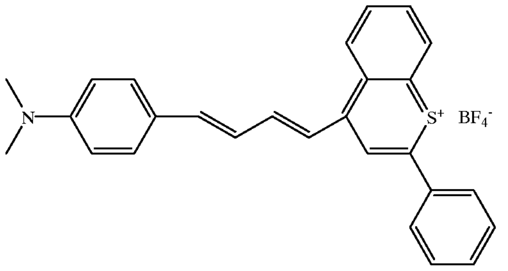

10. The member of claim 8, wherein the photothermal conversion material is present in an amount sufficient to provide the imaging layer with a transmission optical density of at least 0.2 at the operating wavelength of a laser provided as an imaging light source.

11. The member of claim 10, having an imaging layer transmission optical density of at least 1.0.

12. The member of claim 1, wherein the imaging layer has a average dry thickness in the range of about 0.1 to 10 $\mu$m.

13. A method of imaging comprising:

(a) providing an imaging member prepared by the process comprising applying to a support a heat-sensitive imaging layer which comprises at least one heat-sensitive polymer capable of undergoing transformation from a hydrophilic to hydrophobic or from a hydrophobic to hydrophilic state, wherein the transformation occurs such that the activation energy Ea and the Arrhenius pre-exponential factor A associated with the transformation fulfill the relationships:

$$\ln(A) \geqq 0.4\ Ea + 8.84, \text{ and}$$

$$\ln(A) \leqq 1.69\ Ea - 14.37; \text{ and}$$

(b) imagewise exposing the imaging member to energy to provide exposed and unexposed areas in the imaging layer, whereby exposed areas are rendered more oleophilic or more hydrophilic than the unexposed areas by heat provided by the imagewise exposing.

14. A method of printing comprising:

(a) providing an imaging member prepared by the process comprising applying to a support a heat-sensitive imaging layer which comprises at least one heat-sensitive polymer capable of undergoing transformation from a hydrophilic to hydrophobic or from a hydrophobic to hydrophilic state, wherein the transformation occurs such that the activation energy Ea and the Arrhenius pre-exponential factor A associated with the transformation fulfill the relationships:

$$\ln(A) \geqq 0.4\ Ea+8.84, \text{ and}$$

$$\ln(A) \leqq 1.69\ Ea-14.37;$$

(b) imagewise exposing the imaging member to energy to provide exposed and unexposed areas in the imaging layer, whereby exposed areas are rendered more oleophilic or more hydrophilic than the unexposed areas by heat provided by the imagewise exposing;

(c) contacting the imagewise exposed imaging member with a lithographic printer ink; and (d) transferring imagewise the ink to a receiving material.

15. An imaging member comprising a support having applied thereto a heat-sensitive imaging layer which comprises at least one heat-sensitive polymer capable of undergoing transformation from a hydrophilic to hydrophobic state or hydrophobic to hydrophilic state, wherein the transformation occurs such that the activation energy Ea and the Arrhenius pre-exponential factor A associated with the transformation fulfill the relationships:

$$\ln(A) \geqq 0.4\ Ea+8.84; \text{ and}$$

$$\ln(A) \leqq 1.69\ Ea-14.37.$$

16. The member of claim 15, wherein Ea and A fulfill the relationships:

$$\ln(A) \geqq 0.4\ Ea+11.05; \text{ and}$$

$$\ln(A) \leqq 1.69\ Ea-15.83.$$

* * * * *

UNITED STATES PATENT AND TRADEMARK OFFICE

CERTIFICATE OF CORRECTION

PATENT NO. : 6,146,812
DATED : November 21, 2000
INVENTOR(S) : Leon et al.

It is certified that error appears in the above-identified patent and that said Letters Patent is hereby corrected as shown below:

Title page,
In the drawing, "Ea (mJ)" should read -- Ea (kcal/mol) --

Drawings,
Fig. 1, "Ea (mJ)" should read -- Ea (kcal/mol) --

Column 1,
Line 61, "ofthe" should read -- of the --

Column 3,
Line 40, "700-100° C." should read -- 700-1000° C. --
Line 61, "$^{0}$" should be deleted
Line 12, "$K^{-1}$" should read -- $^{0}K^{-1}$ --
Line 66, "In(A) $\geq$ 0.40Ea + 8.84" should read -- In(A) $\geq$ 0.40Ea + 11.05 --

Column 4,
Line 19, "In(A) $\geq$ 0.40Ea + 11.05" should read -- In(A) $\geq$ 0.40Ea + 8.84 --
Line 38, "In(A) $\leq$ 1.69Ea - 14.37" should read -- In(A) $\leq$ 1.69Ea - 15.83 --
Line 49, "In(A) 1.69Ea - 15.83" should read -- In(A) $\leq$ 1.69Ea - 14.37 --
Line 58, "shelflife" should read -- shelf life --

Column 5,
Line 7, "equation 1" should read -- equation 2 --; and "equation 2" should read -- equation 1 --
Equation (1), "In(A) $\geq$ 0.40Ea + 8.84" should read -- In(A) $\geq$ 0.40Ea + 11.05 --
Equation (2), "In(A) $\geq$ 0.40Ea + 11.05" should read -- In(A) $\geq$ 0.40Ea + 8.84 --
Lines 15-16, "equation 3" should read -- equation 4 --; and "equation 4" should read -- equation 3 --
Equation (3), "In(A) $\leq$ 1.69Ea - 14.37" should read -- In(A) $\leq$ 1.69Ea - 15.83 --
Equation (4), "In(A) $\leq$ 1.69Ea - 15.83" should read -- In(A) $\leq$ 1.69Ea - 14.37 --

Column 6,
Line 19, "know" should read -- known --
Line 50, "ofthe" should read -- of the --

Column 7,
Table A, (IR Dye 2): "$So_3^-$" should read -- $SO_3^-$ --

UNITED STATES PATENT AND TRADEMARK OFFICE

CERTIFICATE OF CORRECTION

PATENT NO. : 6,146,812 
DATED : November 21, 2000
INVENTOR(S) : Leon et al.

It is certified that error appears in the above-identified patent and that said Letters Patent is hereby corrected as shown below:

Column 8,
Line 58, "mm" should read -- $\mu$m --
Line 67, "ofthe" should read -- of the --

Column 9,
Line 58, "kCal/mol" should read -- kcal/mol --

Column 10,
Line 1, "frissed' should read -- frittered --

Column 11,
Lines 7 and 50, "Kcal/mol" should read -- kcal/mol --
Line 27, "250 round" should read -- 250 ml round --
Line 60, "(1.08 $g/m^2$" should read -- (1.08 $g/m^2$) --

Column 12,
Line 10, "1 H NMR" should read -- 1H NMR --
Line 40, "Kcal/mol" should read -- kcal/mol --
Line 64, "product" should read -- produce --

Column 13,
Line 56, "ofthe" should read -- of the --
Line 57, "Kcal/mol" should read -- kcal/mol --

Column 14,
Line 7, "methacriylate" should read -- methacrylate --
Line 12, "solution...etc." should be appended to previous line
Line 39, "Kcal/mol" should read -- kcal/mol --
Line 46, "Dyc" should read -- Dye --
Line 52, "digitially" should read -- digitally --

Column 15,
Line 7, "-tetralone" should read -- -tetralone -- and "-methacrvloyl-" should read -- -methacryloyl- --
Lines 10 and 15, "-tetralone" should read -- $\propto$-tetralone --
Lines 11 and 16, "-Tetralone" should read -- $\propto$-Tetralone --
Line 26, "polymerwas" should read -- polymer was --
Line 27, "aBio-Rad" should read -- a Bio-Rad --

UNITED STATES PATENT AND TRADEMARK OFFICE
CERTIFICATE OF CORRECTION

PATENT NO. : 6,146,812
DATED : November 21, 2000
INVENTOR(S) : Leon et al.

It is certified that error appears in the above-identified patent and that said Letters Patent is hereby corrected as shown below:

Column 17,
Line 61, "a" should read -- an --
(IR Dye 2), "$So_3^-$" should read -- $SO_3^-$ --

Signed and Sealed this

Nineteenth Day of November, 2002

*Attest:*

JAMES E. ROGAN

*Attesting Officer* *Director of the United States Patent and Trademark Office*